United States Patent
Kim et al.

(10) Patent No.: US 11,495,545 B2
(45) Date of Patent: Nov. 8, 2022

(54) SEMICONDUCTOR PACKAGE INCLUDING A BRIDGE DIE

(71) Applicant: SK hynix Inc., Icheon-si (KR)

(72) Inventors: Jong Hoon Kim, Suwon-si (KR); Ki Jun Sung, Cheongju-si (KR); Ki Bum Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 178 days.

(21) Appl. No.: 16/787,705

(22) Filed: Feb. 11, 2020

(65) Prior Publication Data
US 2020/0273801 A1 Aug. 27, 2020

Related U.S. Application Data

(63) Continuation-in-part of application No. 16/665,970, filed on Oct. 28, 2019, now Pat. No. 11,322,446.

(30) Foreign Application Priority Data

Feb. 22, 2019 (KR) .......................... 10-2019-0021453
Feb. 4, 2020 (KR) .......................... 10-2020-0013339

(51) Int. Cl.
*H01L 23/31* (2006.01)
*H01L 23/538* (2006.01)
(Continued)

(52) U.S. Cl.
CPC ......... *H01L 23/5385* (2013.01); *H01G 4/012* (2013.01); *H01L 23/5386* (2013.01); *H01L 23/642* (2013.01); *H01L 24/16* (2013.01); *H01L 24/32* (2013.01); *H01L 24/73* (2013.01); *H01L 25/16* (2013.01); *H01L 25/18* (2013.01); *H01L 2224/16145* (2013.01); *H01L 2224/32145* (2013.01); *H01L 2224/73203* (2013.01); *H01L 2224/73253* (2013.01)

(58) Field of Classification Search
None
See application file for complete search history.

(56) References Cited

U.S. PATENT DOCUMENTS 9,773,757 B2    9/2017   Yu et al.
2011/0037157 A1*  2/2011  Shin .................. H01L 25/50
                                                          257/E21.705

(Continued)

FOREIGN PATENT DOCUMENTS

KR    101762033 B1    7/2017

*Primary Examiner* — Daniel Whalen
(74) *Attorney, Agent, or Firm* — William Park & Associates Ltd.

(57) ABSTRACT

A semiconductor package includes an outer redistributed line (RDL) structure, a first semiconductor chip disposed on the outer RDL structure, a stack module stacked on the first semiconductor chip, and a bridge die stacked on the outer RDL structure. A portion of the stack module laterally protrudes from a side surface of the first semiconductor chip. The bridge die supports the protruding portion of the stack module. The stack module includes an inner RDL structure, a second semiconductor chip disposed on the inner RDL structure, a capacitor die disposed on the inner RDL structure, and an inner encapsulant. The capacitor die acts as a decoupling capacitor of the second semiconductor chip.

10 Claims, 13 Drawing Sheets

(51) Int. Cl.
*H01L 25/18* (2006.01)
*H01L 25/16* (2006.01)
*H01L 23/64* (2006.01)
*H01L 23/00* (2006.01)
*H01G 4/012* (2006.01)

(56) References Cited

U.S. PATENT DOCUMENTS

2013/0277831 A1 10/2013 Yoon et al.
2014/0264836 A1 9/2014 Chun et al.
2019/0057933 A1 2/2019 Lin

* cited by examiner

SEMICONDUCTOR PACKAGE INCLUDING A BRIDGE DIE

CROSS-REFERENCE TO RELATED APPLICATIONS

The present application is a continuation-in-part of U.S. patent application Ser. No. 16/665,970, filed on Oct. 28, 2019, which claims priority under 35 U.S.C 119(a) to Korean Patent Application No. 10-2019-0021453, filed on Feb. 22, 2019, and the present application claims priority under 35 U.S.C 119(a) to Korean Patent Application No. 10-2020-0013339, filed on Feb. 4, 2020.

BACKGROUND

1. Technical Field

The present disclosure relates to semiconductor package technologies and, more particularly, to semiconductor packages including a bridge die.

2. Related Art

Recently, a lot of effort has been focused on integrating a plurality of semiconductor chips into a single semiconductor package. That is, attempts to increase package integration density have been made to realize high performance semiconductor packages that process a large amount of data at a high speed with a multi-functional operation. For example, a system-in-package (SiP) technique may be regarded as an attractive candidate for realizing the high performance semiconductor packages. The plurality of semiconductor chips included in each SiP are disposed side-by-side. However, this may cause difficulty in reducing a width of the SiP. Thus, various techniques for disposing a plurality of semiconductor chips in the SiP package have been proposed to reduce a size of the SiP.

SUMMARY

According to an embodiment, a semiconductor package includes an outer redistributed line (RDL) structure, a first semiconductor chip disposed on the outer RDL structure, a stack module stacked on the first semiconductor chip such that a portion of the stack module laterally protrudes from a side surface of the first semiconductor chip in a plan view, and a bridge die stacked on the outer RDL structure to support the protruding portion of the stack module and configured to include conductive through vias electrically connecting the stack module to the outer RDL structure. The stack module includes an inner RDL structure, a second semiconductor chip disposed on the inner RDL structure such that chip pads of the second semiconductor chip are electrically connected to the inner RDL structure, a capacitor die disposed on the inner RDL structure to be spaced apart from the second semiconductor chip and configured to include a capacitor electrically connected to the chip pads through the inner RDL structure, and an inner encapsulant formed on the inner RDL structure to cover the second semiconductor chip and the capacitor die.

DETAILED DESCRIPTION OF THE EMBODIMENTS

Figure 1:
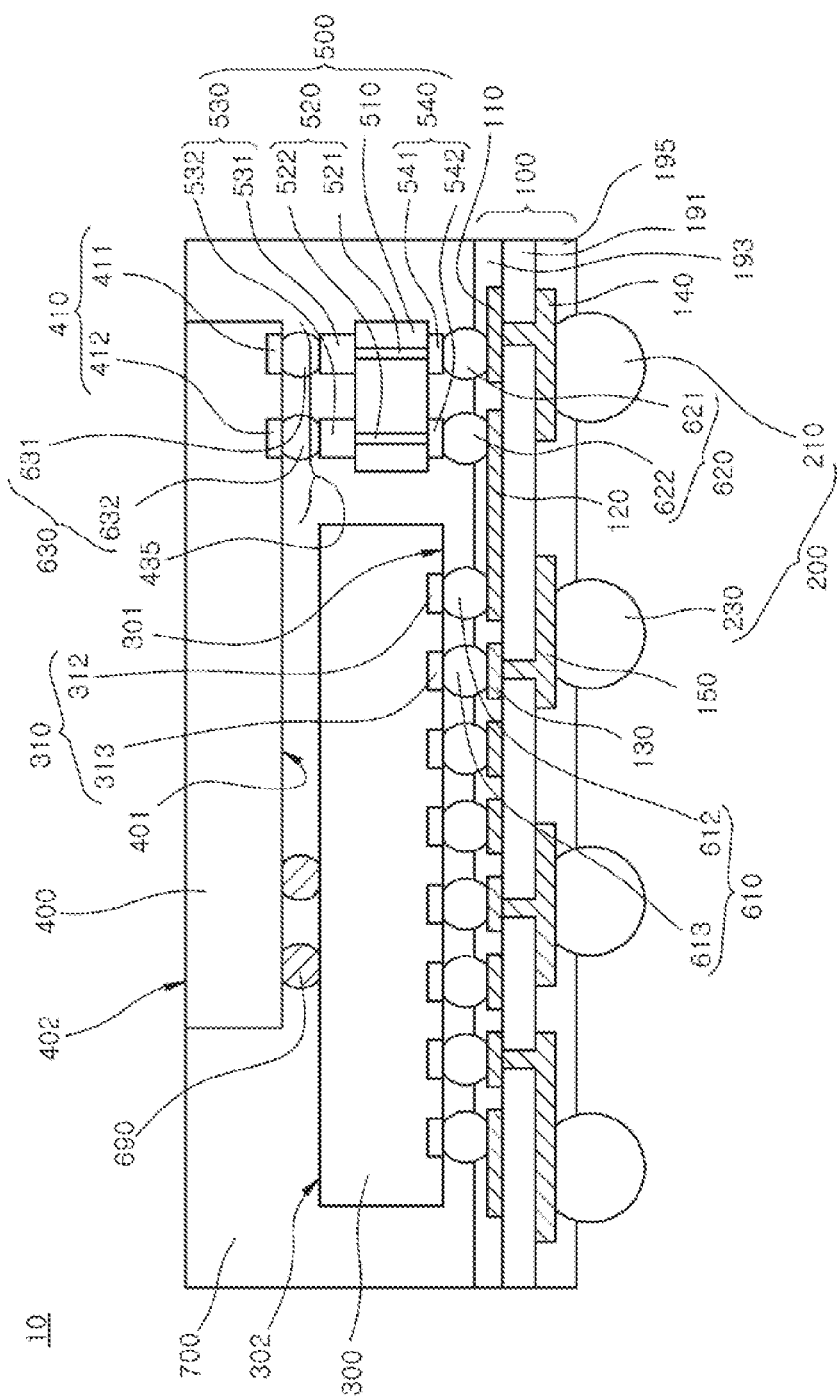
FIG. 1 is a cross-sectional view illustrating a system-in-package (SiP) according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A system-in-package (SiP) may correspond to a semiconductor package, and the semiconductor package may include electronic devices such as semiconductor chips or semiconductor dies. The semiconductor chips or the semiconductor dies may be obtained by separating a semiconductor substrate, such as a wafer, into a plurality of pieces using a die sawing process. The semiconductor chips may correspond to memory chips, logic chips, application specific integrated circuits (ASIC) chips, application processors (APs), graphic processing units (GPUs), central processing units (CPUs) or system-on-chips (SoCs). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a cross-sectional view illustrating a system-in-package (SiP) 10 according to an embodiment.

Referring to FIG. 1, the SiP 10 may be configured to include a redistributed line (RDL) structure 100, a first semiconductor chip 300, a second semiconductor chip 400, and a bridge die 500.

The first semiconductor chip 300 may be disposed on the RDL structure 100. The second semiconductor chip 400 may be stacked on a surface of the first semiconductor chip 300 opposite to the RDL structure 100 to overlap with the first semiconductor chip 300. The second semiconductor chip 400 may be stacked on the first semiconductor chip 300 to have a protrusion 435 corresponding to an overhang that laterally protrudes from a vertical line aligned with a side surface of the first semiconductor chip 300. The bridge die 500 may be disposed on the RDL structure 100 to support the protrusion 435 of the second semiconductor chip 400. The bridge die 500 may be disposed between the protrusion 435 of the second semiconductor chip 400 and the RDL structure 100 and may be disposed to be laterally spaced apart from the first semiconductor chip 300 in the same direction as the protrusion 435.

The SiP 10 may further include a molding layer 700 formed on the RDL structure 100. The molding layer 700 may be formed to cover the first semiconductor chip 300 and the bridge die 500. The molding layer 700 may extend to cover the second semiconductor chip 400. The molding layer 700 may be formed to surround and protect the second semiconductor chip 400 and to reveal a second surface 402 of the second semiconductor chip 400 opposite to the first semiconductor chip 300. In the event that the molding layer 700 is formed to reveal the second surface 402 of the second semiconductor chip 400, heat from the second semiconductor chip 400 and the first semiconductor chip 300 which is generated by an operation of the SiP 10 may be more readily dissipated to an outside space through the second surface 402 of the second semiconductor chip 400. The molding layer 700 may be formed of any one of various molding materials or encapsulating materials. For example, the molding layer 700 may be formed of an epoxy molding compound (EMC) material.

Figure 2:
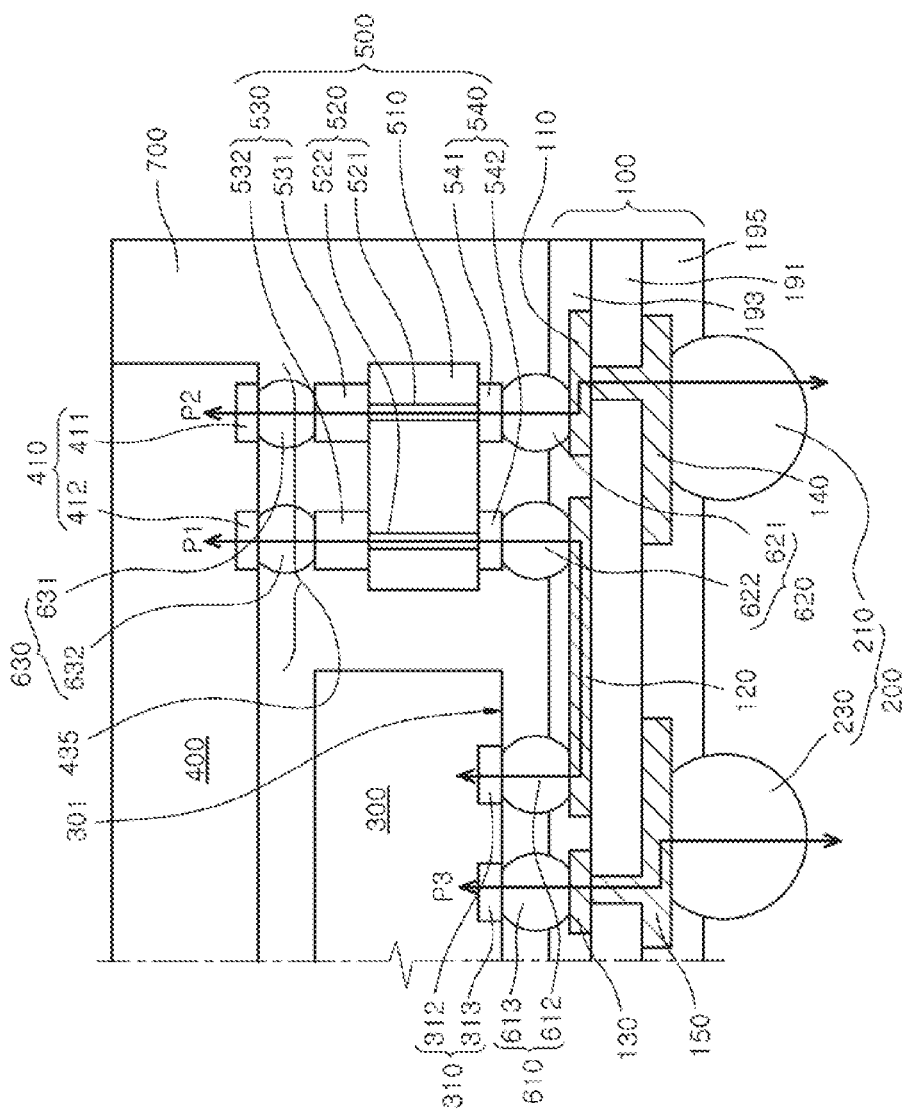
FIG. 2 is an enlarged cross-sectional view illustrating a portion (including a bridge die) of FIG. 1.

FIG. 2 is an enlarged cross-sectional view illustrating a portion (including the bridge die 500) of FIG. 1.

Referring to FIGS. 1 and 2, the RDL structure 100 may include a first RDL pattern 120. The first RDL pattern 120 may be a conductive pattern having a first end overlapping with a portion of the first semiconductor chip 300 and a second end overlapping with a portion of the bridge die 500.

The first semiconductor chip 300 may include a first group of chip pads 310. The first semiconductor chip 300 may be disposed on the RDL structure 100 such that a first chip pad 312 of the first semiconductor chip 300 is electrically connected to a first end of the first RDL pattern 120. The first chip pad 312 may be any one of the first group of chip pads 310. The first semiconductor chip 300 may be mounted on the RDL structure 100 in a flip chip form such that the first group of chip pads 310 of the first semiconductor chip 300 face the RDL structure 100.

A first group of inner connectors 610 may be disposed between the first semiconductor chip 300 and the RDL structure 100 to electrically connect the first semiconductor chip 300 to the RDL structure 100. The first group of inner connectors 610 may be conductive bumps or solder bumps. A fifth inner connector 612 may be bonded to a portion of the first RDL pattern 120 to electrically connect the first chip pad 312 to the first RDL pattern 120. The fifth inner connector 612 may be any one of the first group of inner connectors 610.

The second semiconductor chip 400 may include a second group of chip pads 410 disposed on the protrusion 435 of the second semiconductor chip 400. The second semiconductor chip 400 may be mounted on the first semiconductor chip 300 in a flip-chip form. Thus, a second chip pad 412 disposed on the protrusion 435 may face the RDL structure 100. Because the second chip pad 412 is disposed on the protrusion 435, the second chip pad 412 might not vertically overlap with the first semiconductor chip 300 to be revealed in an outside region of the first semiconductor chip 300. The second chip pad 412 may be any one of the second group of chip pads 410.

The bridge die 500 may be disposed on the RDL structure 100 to overlap with the protrusion 435 of the second semiconductor chip 400. The bridge die 500 may be configured to include a body 510 and a plurality of through vias 520 penetrating the body 510. Although not shown in the drawings, an insulation layer may be additionally disposed between the body 510 and each of the through vias 520 to electrically insulate the through vias 520 from the body 510. A first through via 522 may be disposed to overlap with the second chip pad 412 and may be electrically connected to the second chip pad 412 of the second semiconductor chip 400. The first through via 522 may be any one of the through vias 520. The first through via 522 may be disposed to overlap with a second end of the first RDL pattern 120 and may be electrically connected to the first RDL pattern 120 overlapping with the first through via 522. The first through via 522 may be disposed to electrically connect the second chip pad 412 to the first RDL pattern 120 in a vertical direction.

The bridge die 500 may further include a plurality of post bumps 530. A first post bump 532 may be disposed on the body 510 to protrude from a top surface of the body 510. The first post bump 532 may be connected to a top portion of the first through via 522. The first post bump 532 may be any one of the post bumps 530.

A third group of inner connectors 630 may be disposed between the bridge die 500 and the second semiconductor chip 400 to electrically connect the bridge die 500 to the second semiconductor chip 400. The bridge die 500 may be bonded to the second semiconductor chip 400 by the third group of inner connectors 630 and may be electrically connected to the second semiconductor chip 400 through the third group of inner connectors 630. A second inner connector 632 may electrically connect the second chip pad 412 to the first post bump 532. The second inner connector 632 may be any one of the third group of inner connectors 630. The bridge die 500 may further include via pads 540 disposed on a bottom surface of the body 510. A first via pad 542 may be connected to a bottom portion of the first through via 522. The first via pad 542 may be any one of the via pads 540.

A second group of inner connectors 620 may be disposed between the bridge die 500 and the RDL structure 100 to electrically connect the bridge die 500 to the RDL structure 100. The bridge die 500 may be bonded to the RDL structure 100 by the second group of inner connectors 620 and may be electrically connected to the RDL structure 100 through the second group of inner connectors 620. A first inner connector 622 may be bonded and electrically coupled to the first via pad 542. The first inner connector 622 may be any one of the second group of inner connectors 620. The first inner connector 622 may be bonded to a portion of the first RDL pattern 120 to electrically connect the first via pad 542 to the first RDL pattern 120.

Figure 3:
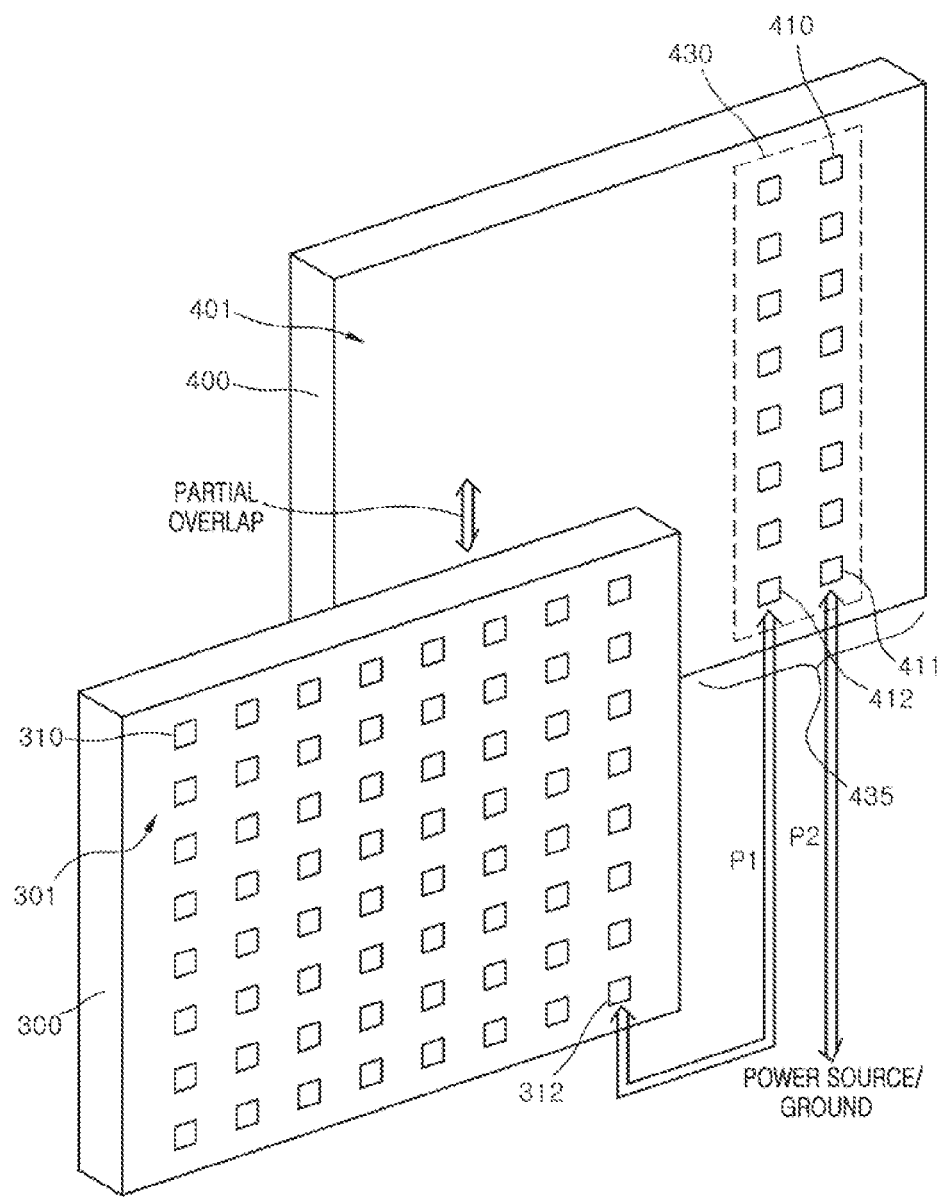
FIG. 3 is a perspective view illustrating electrical paths connecting semiconductor chips shown in FIG. 2 to each other.

FIG. 3 is a perspective view illustrating a first electrical path P1 electrically connecting the first and second semiconductor chips 300 and 400 shown in FIG. 2 to each other.

Referring to FIGS. 2 and 3, the bridge die 500 structurally supports the protrusion 435 of the second semiconductor chip 400 and also provides a portion of the first electrical path P1 that electrically connects the second semiconductor chip 400 to the first semiconductor chip 300. The first electrical path P1 may be configured to include the second chip pad 412 of the second semiconductor chip 400, the second inner connector 632, the first post bump 532, the first through via 522, the first via pad 542, the first inner connector 622, the first RDL pattern 120, the fifth inner connector 612, and the first chip pad 312 of the first semiconductor chip 300.

The first semiconductor chip 300 may be a processor that performs logical operations of data. For example, the first semiconductor chip 300 may include a system-on-chip (SoC) such as an application processor performing logical operations. The second semiconductor chip 400 may be a memory semiconductor chip that stores the data. The memory semiconductor chip may be used as a cache memory chip that temporarily stores and provides the data used in logical operations of the SoC. The second semiconductor chip 400 may be configured to include a DRAM device.

The first group of chip pads 310 of the first semiconductor chip 300 may be uniformly disposed on an entire region of a first surface 301 of the first semiconductor chip 300, as illustrated in FIG. 3. The second group of chip pads 410 of the second semiconductor chip 400 may be disposed on the protrusion 435 of the second semiconductor chip 400. The second group of chip pads 410 of the second semiconductor chip 400 may be disposed on a portion (i.e., the protrusion 435) of the second semiconductor chip 400 that overhangs (does not overlap with) the first semiconductor chip 300. The second group of chip pads 410 of the second semiconductor chip 400 may be disposed on an peripheral region 430 of the second semiconductor chip 400. The peripheral region 430 on which the second group of chip pads 410 are disposed may be located on a first surface 401 of the protrusion 435 of the second semiconductor chip 400.

The second semiconductor chip 400 may partially overlap with the first semiconductor chip 300. The other region of the second semiconductor chip 400 except the protrusion 435 may overlap with the first semiconductor chip 300. The other region of the second semiconductor chip 400 may be shaded by the first semiconductor chip 300. Thus, the second group of chip pads 410 of the second semiconductor chip 400 might not be disposed on the other region of the second semiconductor chip 400.

The first chip pad 312 may be electrically connected to the second chip pad 412 of the second semiconductor chip 400 through the first electrical path P1. The first chip pad 312 may be one of the first group of chip pads 310. Although FIG. 3 illustrates the first electrical path P1 as a single path, the SiP 10 may include a plurality of first electrical paths P1. In such a case, the first group of chip pads 310 may be electrically connected to the second group of chip pads 410 through the plurality of first electrical paths P1, respectively. In an embodiment, each of the plurality of first electrical paths P1 may be configured to include one of the second group of chip pads 410 of the second semiconductor chip 400, one of the third group of inner connectors 630, one of the post bumps 530, one of the through vias 520, one of the via pads 540, one of the second group of inner connectors 620, one of the first RDL patterns 120, one of the first group of inner connectors 610, and one of the first group of chip pads 310 of the first semiconductor chip 300. Because the second semiconductor chip 400 is electrically connected to the first semiconductor chip 300 through the plurality of first electrical paths P1, multiple input/output (I/O) paths may be provided between the first and second semiconductor chips 300 and 400. That is, because two adjacent semiconductor chips are electrically connected to each other by a plurality of short signal paths corresponding to I/O paths, relatively more data may be simultaneously transmitted between the two adjacent semiconductor chips through the multiple paths than through a single path. Thus, a larger quantity of data may be transmitted from the first semiconductor chip 300 to the second semiconductor chip 400 or vice versa at a given speed using the parallel paths. If the first semiconductor chip 300 is a logic chip (e.g., a processor chip) and the second semiconductor chip 400 is a memory chip, the first semiconductor chip 300 may operate together with the second semiconductor chip 400 acting as a high performance cache memory. Accordingly, it may be possible to improve the operation speed and the performance of the SiP 10 including the first and second semiconductor chips 300 and 400.

Referring again to FIG. 2, the second semiconductor chip 400 may further include a third chip pad 411 disposed on the protrusion 435 to be spaced apart from the second chip pad 412. The bridge die 500 may further include a second post bump 531 which is disposed to substantially overlap with the third chip pad 411. The bridge die 500 may further include a second through via 521 which is electrically connected to the second post bump 531 and which is disposed to be spaced apart from the first through via 522. The bridge die 500 may further include a second via pad 541 which is electrically connected to the second through via 521.

The RDL structure 100 may further include a second RDL pattern 110 which is disposed to be spaced apart from the first RDL pattern 120. The second RDL pattern 110 may be disposed to have a portion overlapping with the second via pad 541. The second RDL pattern 110 may be electrically connected to a first outer connector 210 through a fifth RDL pattern 140. The first outer connector 210 may be one of a plurality of outer connectors 200 connected to the RDL structure 100. The outer connectors 200 may act as connection terminals or connection pins that electrically connect the SiP 10 to an external device. The outer connectors 200 may be connection members such as solder balls.

The RDL structure 100 may further include a first dielectric layer 191 disposed between the fifth RDL pattern 140 and the second RDL pattern 110. The first and second RDL patterns 120 and 110 may be disposed on a top surface of the first dielectric layer 191, and the fifth RDL pattern 140 may be disposed on a bottom surface of the first dielectric layer 191. The fifth RDL pattern 140 may substantially penetrate the first dielectric layer 191 to be connected to the second RDL pattern 110. The RDL structure 100 may further include a second dielectric layer 193 which is disposed on the top surface of the first dielectric layer 191 opposite to the outer connectors 200 to electrically isolate the second RDL pattern 110 from the first RDL pattern 120. The RDL structure 100 may further include a third dielectric layer 195 which is disposed on the bottom surface of the first dielectric layer 191 opposite to the first semiconductor chip 300 to electrically isolate the fifth RDL pattern 140 from an outside space of the SiP 10. The first outer connector 210 may substantially penetrate the third dielectric layer 195 to be connected to the fifth RDL pattern 140.

A sixth inner connector 621 may be bonded to the second RDL pattern 110 to electrically connect the second via pad 541 to the second RDL pattern 110. The sixth inner connector 621 may be any one of the second group of inner connectors 620 that electrically connect the bridge die 500 to the RDL structure 100. A seventh inner connector 631 may electrically connect the second post bump 531 to the third chip pad 411. The seventh inner connector 631 may be any one of the third group of inner connectors 630 that electrically connect the bridge die 500 to the second semiconductor chip 400.

Referring to FIGS. 2 and 3, a second electrical path P2 may be provided to include the first outer connector 210, the fifth RDL pattern 140, the second RDL pattern 110, the sixth inner connector 621, the second via pad 541, the second through via 521, the second post bump 531, the seventh inner connector 631, and the third chip pad 411. The second electrical path P2 may be a path electrically connecting the second semiconductor chip 400 to the first outer connector 210. The second electrical path P2 might not be electrically connected to the first semiconductor chip 300 unlike the first electrical path P1. The first electrical path P1 may electrically connect the first and second semiconductor chips 300 and 400 to each other such that the first and second semiconductor chips 300 and 400 communicate with each other. In contrast, the second electrical path P2 may be used as an electrical path for supplying a power supply voltage or a ground voltage to the second semiconductor chip 400.

Referring again to FIG. 2, the RDL structure 100 may further include a third RDL pattern 130 which is disposed to be spaced apart from the first RDL pattern 120 and the second RDL pattern 110. The third RDL pattern 130 may be located to overlap with the first semiconductor chip 300. The third RDL pattern 130 may be electrically connected to a second outer connector 230 through a sixth RDL pattern 150. The first semiconductor chip 300 may further include a fourth chip pad 313 which is disposed to be spaced apart from the first chip pad 312. A third inner connector 613 may be disposed to electrically connect the fourth chip pad 313 to the third RDL pattern 130. The third inner connector 613 may be any one of the first group of inner connectors 610 electrically connecting the first semiconductor chip 300 to the RDL structure 100.

A third electrical path P3 may be provided to include the fourth chip pad 313, the third inner connector 613, the third RDL pattern 130, the sixth RDL pattern 150, and the second outer connector 230. The third electrical path P3 may be an electrical path electrically connecting the first semiconductor chip 300 to the second outer connector 230. The first semiconductor chip 300 may communicate with an external device through the third electrical path P3 or may receive electric power from the external device through the third electrical path P3.

Figure 4:
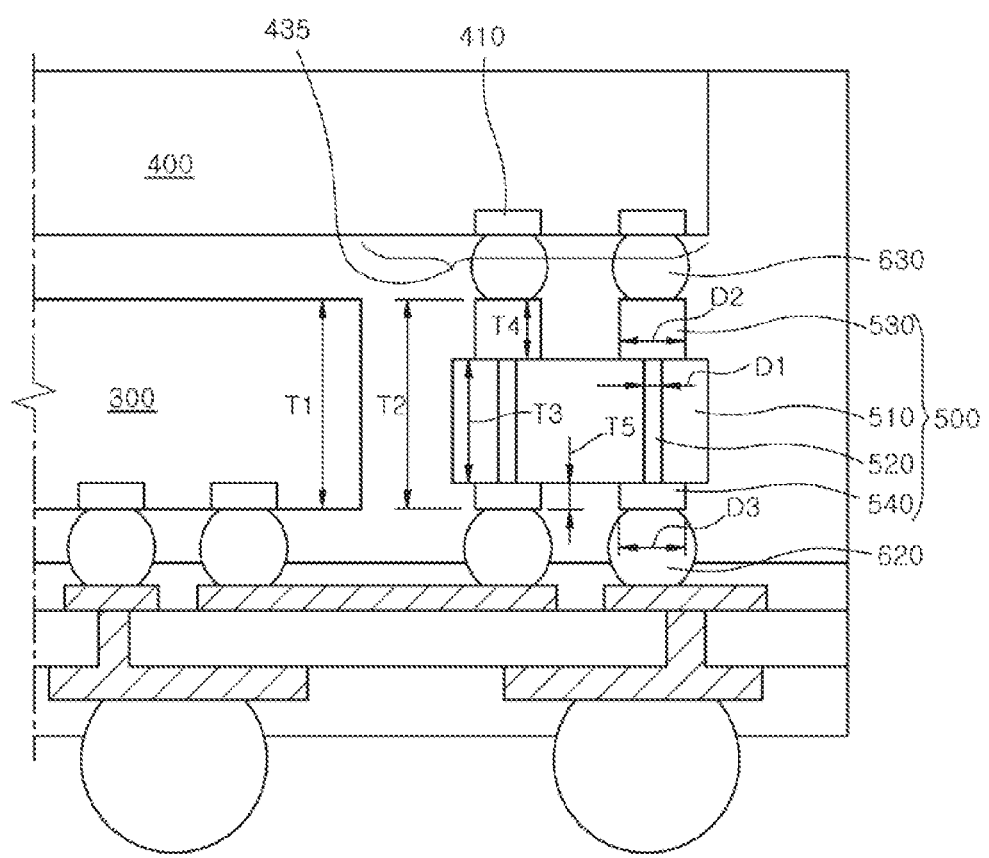
FIG. 4 is an enlarged cross-sectional view focusing on a bridge die of FIG. 1.
Figure 5:
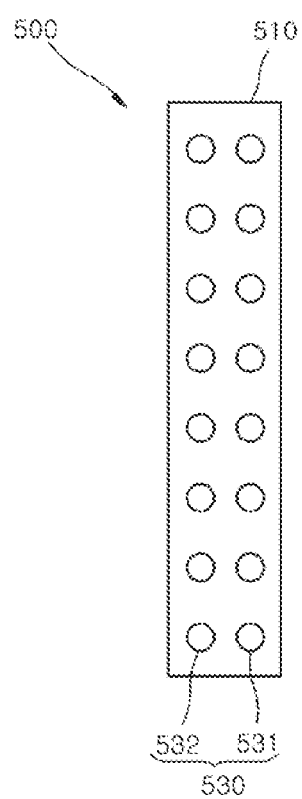
FIG. 5 is a plan view illustrating an array of post bumps included in the bridge die of FIG. 4.

FIG. 4 is an enlarged cross-sectional view illustrating a portion (including the bridge die 500) of FIG. 1. FIG. 5 is a plan view illustrating the post bumps 530 of the bridge die 500 shown in FIG. 4.

Referring to FIGS. 1 and 4, the body 510 of the bridge die 500 may correspond to a semiconductor substrate such as a silicon substrate. When the body 510 of the bridge die 500 is made of a silicon material, the through vias 520 may be formed using photolithography processes applied to a silicon wafer. The through vias 520 of the bridge die 500 may correspond to through silicon vias (TSVs) having a diameter D1. The diameter D1 may be less than a diameter of through mold vias (TMVs) penetrating a mold layer. Thus, it may be possible to increase the number of the through vias 520 formed in the body 510 having a limited size.

As illustrated in FIG. 3, the second group of chip pads 410 may be densely disposed on the protrusion 435 of the second semiconductor chip 400. The post bumps 530 of the bridge die 500, which are electrically connected to the second group of chip pads 410, may include at least two bumps, as illustrated in FIG. 5. In such a case, the through vias 520 of the bridge die 500 may be aligned to overlap with the second group of chip pads 410 such that the post bumps 530 overlap with the second group of chip pads 410 of the second semiconductor chip 400. Because the through vias 520 of the bridge die 500 are formed using a TSV process, the through vias 520 may be formed to have the diameter D1 of a relatively small value, for example, compare to a diameter of TMVs. Thus, it may be possible to maximize the number of the through vias 520 of the bridge die 500, which respectively correspond to a plurality of I/O terminals, a power supply terminal, and a ground terminal. That is, even though the second group of chip pads 410 are densely disposed, it may be possible to form the through vias 520 of the bridge die 500 such that the through vias 520 are located to have the same pitch size as the second group of chip pads 410. Accordingly, even though the second group of chip pads 410 are densely disposed, it may be possible to vertically connect the second group of chip pads 410 to respective through vias 520 of the bridge die 500 without forming any redistributed lines on the second semiconductor chip 400.

If the diameter D1 of the through vias 520 is reduced, a vertical length of the through vias 520 may also be reduced. When the through vias 520 are formed to penetrate the body 510 having a thickness T3, there may be a limitation in reducing the diameter D1 of the through vias 520 because of restriction of an aspect ratio of via holes filled with the through vias 520. In order to reduce the diameter D1 of the through vias 520 of the bridge die 500, it may be necessary to reduce the thickness T3 of the body 510 to meet the restriction of an aspect ratio of the via holes in which the through vias 520 are formed. In order to increase the number of the through vias 520 formed in the body 510, it may be necessary to reduce the thickness T3 of the body 510 less than a thickness T1 of the first semiconductor chip 300. In such a case, it may be possible to reduce the diameter D1 of the through vias 520 of the bridge die 500.

In order that the bridge die 500 structurally supports the second semiconductor chip 400, it may be effective that a total thickness T2 of the bridge die 500 is set to be equal to the thickness T1 of the first semiconductor chip 300. For example, the thickness T3 of the body 510, which is less than the thickness T1 of the first semiconductor chip 300, may be compensated by a thickness T4 of the post bumps 530 of the bridge die 500 and a thickness T5 of the via pads 540 of the bridge die 500. That is, the total thickness T2 of the bridge die 500 may be adjusted to be equal to the thickness T1 of the first semiconductor chip 300 by appropriately adjusting the thickness T4 of the post bumps 530 of the bridge die 500. The total thickness T2 of the bridge die 500 may include the thickness T4 of the post bumps 530 of the bridge die 500, the thickness T5 of the via pads 540 of the bridge die 500, and the thickness T3 of the body 510.

The post bumps 530 may be directly bonded to the third group of inner connectors 630, respectively. The first post bump 532 may have a diameter D2 which is greater than the diameter D1 of the through vias 520. Thus, solder bumps used as the third group of inner connectors 630 may be directly bonded to the post bumps 530 of the bridge die 500, respectively. In order that the via pads 540 of the bridge die 500 are directly bonded to the second group of inner connectors 620, the via pads 540 may have a diameter D3 which is greater than the diameter D1 of the through vias 520.

Figure 6:
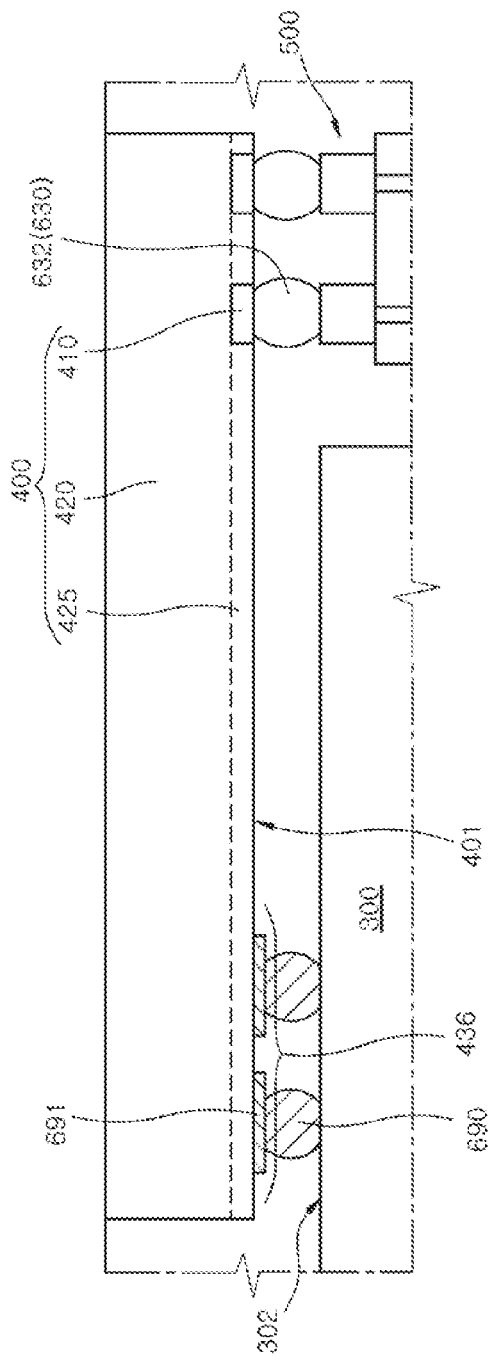
FIG. 6 is an enlarged cross-sectional view illustrating a connection portion between semiconductor chips shown in FIG. 1.

FIG. 6 is an enlarged cross-sectional view illustrating a connection portion between the first and second semiconductor chips 300 and 400 shown in FIG. 1.

Referring to FIGS. 1 and 6, the second semiconductor chip 400 may partially overlap with the first semiconductor chip 300, and the protrusion 435 of the second semiconductor chip 400 may be supported by the bridge die 500. The protrusion 435 of the second semiconductor chip 400 is bonded to the bridge die 500 through the third group of inner connectors 630, and dummy bumps 690 may be used to support an edge 436 of the second semiconductor chip 400 opposite to the protrusion 435. Because the dummy bumps 690 support the edge 436 of the second semiconductor chip 400, it may be possible to prevent the second semiconductor chip 400 from being inclined. Because the dummy bumps 690 are disposed between the first semiconductor chip 300 and the second semiconductor chip 400 when the protrusion 435 of the second semiconductor chip 400 is bonded to the bridge die 500, the second semiconductor chip 400 may maintain a horizontal level.

The dummy bumps 690 may be solder bumps. The dummy bumps 690 may be attached to the first surface 401 of the second semiconductor chip 400. Dummy bonding pads 691 may be formed on the first surface 401 of the second semiconductor chip 400. In such a case, the dummy bumps 690 may be bonded to the dummy bonding pads 691. The dummy bonding pads 691 may be formed on a passivation layer 425 disposed on the first surface 401 of the second semiconductor chip 400. The dummy bonding pads 691 may be formed on the passivation layer 425 using a metal sputtering process. The passivation layer 425 may be formed to cover and electrically insulate a body 420 (made of a silicon material) of the second semiconductor chip 400. Thus, the dummy bumps 690 may be electrically insulated from internal circuits of the second semiconductor chip 400. The dummy bumps 690 may be in contact with a second surface 302 of the first semiconductor chip 300 opposite to the RDL structure 100.

Figure 7:
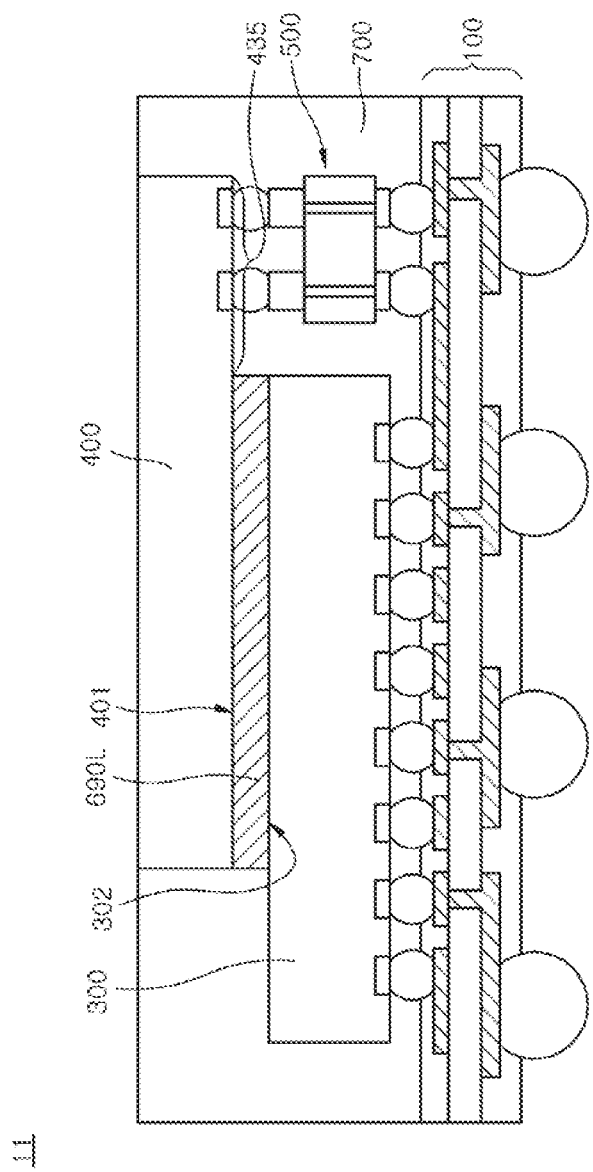
FIG. 7 is a cross-sectional view illustrating a SiP according to another embodiment.

FIG. 7 is a cross-sectional view illustrating a SiP 11 according to another embodiment.

Referring to FIG. 7, the SiP 11 may be configured to include the RDL structure 100, the first semiconductor chip 300, the second semiconductor chip 400, the bridge die 500, and the molding layer 700. The second semiconductor chip 400 may partially overlap with the first semiconductor chip 300, and the protrusion 435 of the second semiconductor chip 400 may be supported by the bridge die 500. An adhesive layer 690L may be disposed between the first and second semiconductor chips 300 and 400. The adhesive layer 690L may support the second semiconductor chip 400. The adhesive layer 690L may prevent the second semiconductor chip 400 from being inclined when the protrusion 435 of the second semiconductor chip 400 is bonded to and supported by the bridge die 500. The adhesive layer 690L may help the second semiconductor chip 400 maintain a horizontal level.

The adhesive layer 690L may be attached to the first surface 401 of the second semiconductor chip 400 and the second surface 302 of the first semiconductor chip 300. The adhesive layer 690L may bond the second semiconductor chip 400 to the first semiconductor chip 300.

Figure 8:
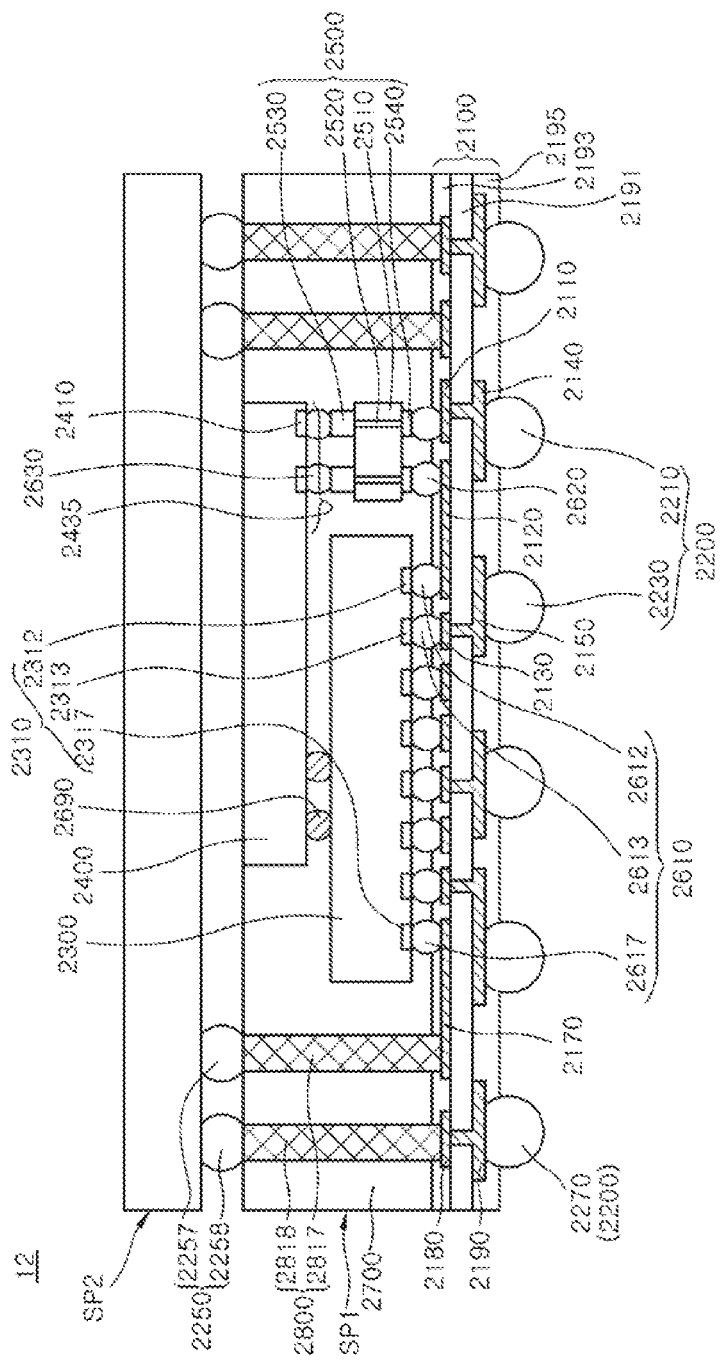
FIG. 8 is a cross-sectional view illustrating a SiP according to yet another embodiment.
Figure 9:
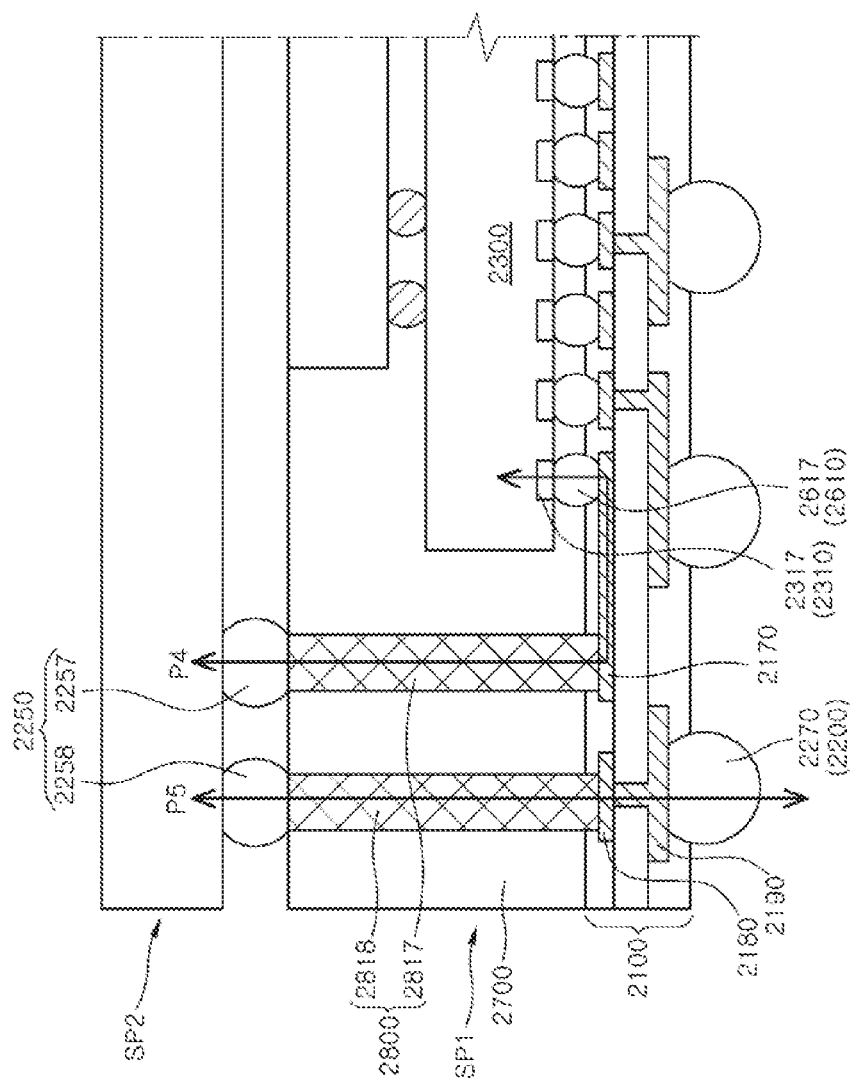
FIG. 9 is a cross-sectional view illustrating a portion (including through mold vias) of FIG. 8.

FIG. 8 is a cross-sectional view illustrating an SiP 12 according to yet another embodiment. FIG. 9 is a cross-sectional view illustrating a portion (including through mold vias (TMVs) 2800) of FIG. 8.

Referring to FIG. 8, the SiP 12 may be realized to have a package-on-package (PoP) shape. The SiP 12 may be configured to include a first sub-package SP1 and the second sub-package SP2 mounted on the first sub-package SP1. The first sub-package SP1 may be configured to include an RDL structure 2100, a first semiconductor chip 2300, a second semiconductor chip 2400, a bridge die 2500, a molding layer 2700, and the TMVs 2800.

The RDL structure 2100 may be configured to include a first RDL pattern 2120, a second RDL pattern 2110, a third RDL pattern 2130, a fourth RDL pattern 2170, a fifth RDL pattern 2140, a sixth RDL pattern 2150, a seventh RDL pattern 2180, and an eighth RDL pattern 2190. The RDL structure 2100 may further include a first dielectric layer 2191, a second dielectric layer 2193, and a third dielectric layer 2195. The first RDL pattern 2120, the second RDL pattern 2110, the third RDL pattern 2130, the fourth RDL pattern 2170, and the seventh RDL pattern 2180 may be disposed on a top surface of the first dielectric layer 2191. The second dielectric layer 2193 may be disposed on the top surface of the first dielectric layer 2191 to electrically insulate the first RDL pattern 2120, the second RDL pattern 2110, the third RDL pattern 2130, the fourth RDL pattern 2170, and the seventh RDL pattern 2180 from each other.

The fifth RDL pattern 2140, the sixth RDL pattern 2150, and the eighth RDL pattern 2190 may be disposed on a bottom surface of the first dielectric layer 2191 opposite to the second dielectric layer 2193. The third dielectric layer 2195 may be formed on the bottom surface of the first dielectric layer 2191 to electrically insulate the fifth RDL pattern 2140, the sixth RDL pattern 2150, and the eighth RDL pattern 2190 from each other.

The RDL structure 2100 may correspond to an interconnection structure electrically connected to the first and second semiconductor chips 2300 and 2400. In another embodiment, a printed circuit board (PCB) may be used as the interconnection structure.

Outer connectors 2200 may be attached to the RDL structure 2100. The outer connectors 2200 may include a first outer connector 2210, a second outer connector 2230, and a third outer connector 2270, which are spaced apart from each other and electrically insulated from each other.

The first semiconductor chip 2300 may include a system-on-chip (SoC), and the second semiconductor chip 2400 may include a first memory semiconductor chip. The second sub-package SP2 may include a second memory semiconductor chip connected to the SoC corresponding to the first semiconductor chip 2300. The second memory semiconductor chip may include a NAND-type flash memory device or a DRAM device. The first memory semiconductor chip may act as a temporary memory device or a buffer memory device, and the second memory semiconductor chip may act as a main memory device.

The first semiconductor chip 2300 may include a plurality of chip pads 2310. The chip pads 2310 of the first semiconductor chip 2300 may include a first chip pad 2312, a fourth chip pad 2313, and a fifth chip pad 2317.

The first semiconductor chip 2300 may be electrically connected to the RDL structure 2100 by a plurality of inner connectors 2610. The inner connectors 2610 may include a third inner connector 2613, a fourth inner connector 2617, and a fifth inner connector 2612.

The second semiconductor chip 2400 may include a protrusion 2435 corresponding to an overhang that laterally protrudes from a vertical line aligned with a side surface of the first semiconductor chip 2300. The second semiconductor chip 2400 include a plurality of chip pads 2410 disposed on the protrusion 2435.

The bridge die 2500 may structurally support the protrusion 2435 of the second semiconductor chip 2400. The bridge die 2500 may be configured to include a body 2510, through vias 2520, post bumps 2530, and via pads 2540.

The bridge die 2500 may be electrically connected to the RDL structure 2100 through inner connectors 2620. The bridge die 2500 may be electrically connected to the second semiconductor chip 2400 through other inner connectors 2630.

A plurality of dummy bumps 2690 may be disposed between the first semiconductor chip 300 and the second semiconductor chip 400 to maintain a horizontal level of the second semiconductor chip 400.

The TMVs 2800 may substantially penetrate the molding layer 2700 to be electrically connected to the RDL structure 2100. The second sub-package SP2 may be disposed on the molding layer 2700 and may be electrically connected to the TMVs 2800 by interconnectors 2250. The interconnectors 2250 may be connection members such as solder balls. Although not shown in the drawings, the second sub-package SP2 may be provided to include a semiconductor die including integrated circuits, internal interconnection lines for electrical connection between components in the semiconductor die, and a molding layer protecting the semiconductor die.

Referring to FIG. 9, a first TMV 2817 corresponding to any one of the TMVs 2800 may be connected to one end of the fourth RDL pattern 2170. The other end of the fourth RDL pattern 2170 may be electrically connected to the fifth chip pad 2317 of the first semiconductor chip 2300 through the fourth inner connector 2617. The first TMV 2817 may be electrically connected to the second sub-package SP2 through a first interconnector 2257 corresponding to any one of the interconnectors 2250. The first interconnector 2257, the first TMV 2817, the fourth RDL pattern 2170, the fourth inner connector 2617, and the fifth chip pad 2317 may constitute a fourth electrical path P4. The fourth electrical path P4 may be a signal path that connects the second sub-package SP2 to the first semiconductor chip 2300.

A second TMV 2818 corresponding to any one of the TMVs 2800 may electrically connect the seventh RDL pattern 2180 to a second interconnector 2258 corresponding to any one of the interconnectors 2250. The seventh RDL pattern 2180 may be connected to the eighth RDL pattern 2190, and the eighth RDL pattern 2190 may be connected to the third outer connector 2270. Thus, the second interconnector 2258, the second TMV 2818, the seventh RDL pattern 2180, the eighth RDL pattern 2190, and the third outer connector 2270 may constitute a fifth electrical path P5. The fifth electrical path P5 may be an electrical path that supplies a power supply voltage or a ground voltage to the second sub-package SP2.

As described above, according to the embodiments, the second semiconductor chip 400 (or 2400) may be stacked on the first semiconductor chip 300 (or 2300) to reduce a width or a size of the SiP 10, 11, or 12. According to the SiP 10, 11, or 12, it may be possible to stack the second semiconductor chip 400 (or 2400) on the first semiconductor chip 300 (or 2300) because the second semiconductor chip 400 (or 2400) is electrically connected to the first semiconductor chip 300 (or 2300) using the bridge die 500 (or 2500).

A process of applying heat to semiconductor chips may degrade characteristics of the semiconductor chips, particularly, memory chips. For example, when heat is applied to DRAM devices, a data retention time of memory cells of the DRAM devices is reduced to decrease a refresh cycle time of the DRAM devices. In addition, if heat is applied to NAND-type flash memory devices, a data retention time of memory cells of the NAND-type flash memory devices may also be reduced.

The SiPs 10, 11, and 12 according to embodiments of the present teachings may be realized to include inner connectors attached to the RDL structure 100 for interconnection between semiconductor chips as well as between an external device and the semiconductor chips. Thus, it may be possible to omit or diminish a thermal process (or an annealing process) for curing a polymer layer which is used to form redistributed lines. As a result, performance of the SiPs 10, 11, and 12 may be improved. For example, if the first and second semiconductor chips 300 and 400 are stacked on the RDL structure 100 to form the SiP 10, 11, or 12 after the RDL structure 100 is formed, it may be possible to prevent the heat from being applied to the first and second semiconductor chips 300 and 400 when a thermal process (or an annealing process) is performed to cure a polymer layer used in formation of the RDL patterns.

Figure 10:
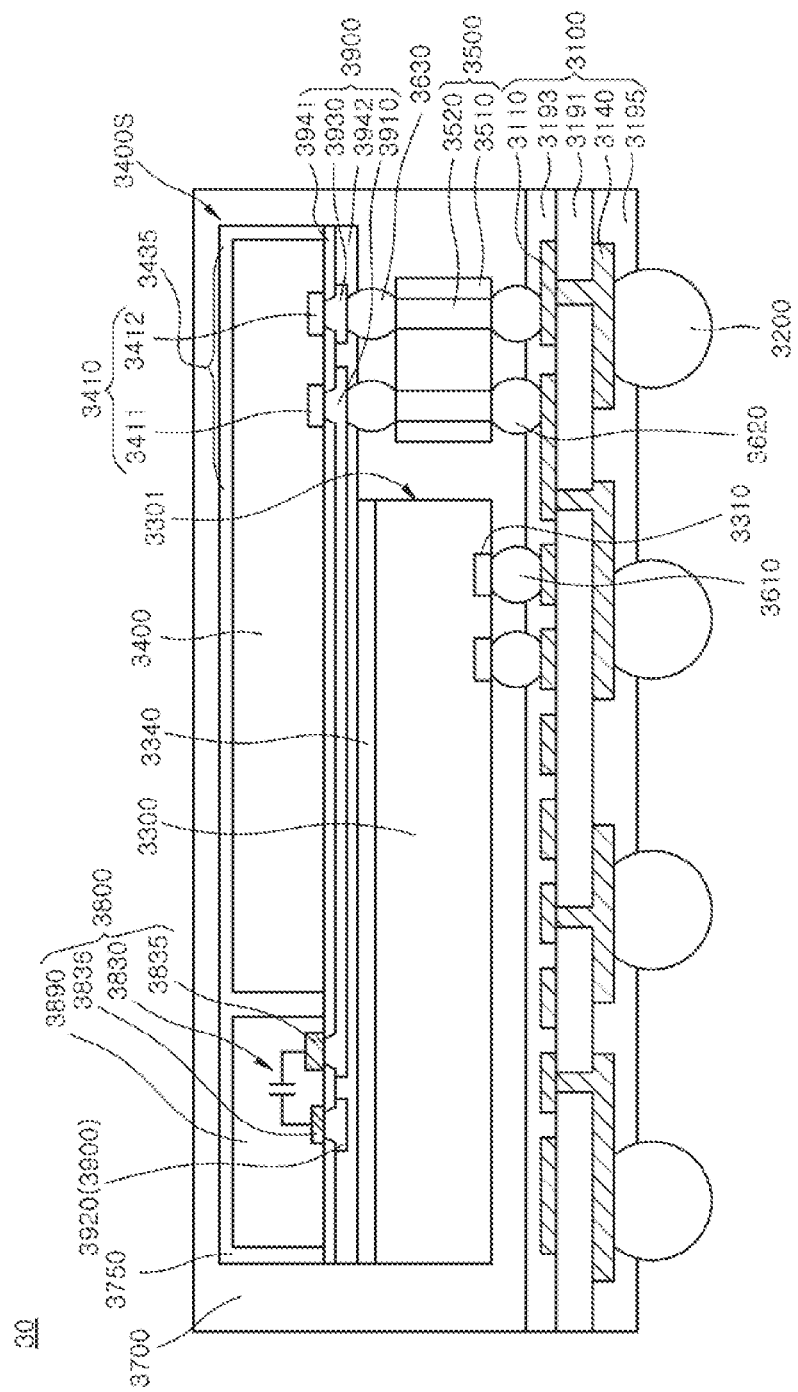
FIG. 10 is a cross-sectional view illustrating a semiconductor package according to an embodiment.

FIG. 10 is a cross-sectional view illustrating a semiconductor package 30 according to an embodiment.

Referring to FIG. 10, the semiconductor package 30 may be configured to include an outer RDL structure 3100, a first semiconductor chip 3300, a stack module 3400S including a second semiconductor chip 3400, a bridge die 3500, and an outer encapsulant 3700. The semiconductor package 30 may correspond to a system-in-package (SiP). For example, the first semiconductor chip 3300 may be configured to include a system-on-chip (SoC), and the second semiconductor chip 3400 may be configured to include a memory semiconductor chip. The memory semiconductor chip may be a memory chip storing data, for example, a DRAM chip, and the SoC may be a logic chip that communicates with the second semiconductor chip 3400 to perform various logical operations.

The first semiconductor chip 3300 may be disposed on the outer RDL structure 3100. The first semiconductor chip 3300 may be disposed on the outer RDL structure 3100 such that a first group of chip pads 3310 corresponding to connection terminals of the first semiconductor chip 3300 face the outer RDL structure 3100. A first group of inner connectors 3610 may electrically connect the first group of chip pads 3310 to the outer RDL structure 3100.

The outer RDL structure 3100 may act as interconnection members that electrically connect the semiconductor package 30 to an external device or an external system. The outer RDL structure 3100 may be configured to include first RDL patterns 3110 disposed on a surface of a first dielectric layer 3191 and second RDL patterns 3140 disposed on another surface of the first dielectric layer 3191 opposite to the first RDL patterns 3110. A second dielectric layer 3193 may be formed on the first dielectric layer 3191 to electrically isolate or insulate the first RDL patterns 3110 from each other. A third dielectric layer 3195 may be formed on a bottom surface of the first dielectric layer 3191 to electrically isolate or insulate the second RDL patterns 3140 from each other. The second RDL patterns 3140 may penetrate the first dielectric layer 3191 to be electrically connected to the first RDL patterns 3110. Outer connectors 3200 may be attached to the second RDL patterns 3140.

The first group of inner connectors 3610 may electrically connect the first group of chip pads 3310 of the first semiconductor chip 3300 to some of the first RDL patterns 3110. A second group of inner connectors 3620 may electrically connect conductive through vias 3520 of the bridge die 3500 to some others of the first RDL patterns 3110. Some yet others of the first RDL patterns 3110 may electrically connect the conductive through vias 3520 of the bridge die 3500 to the first semiconductor chip 3300, like the first RDL patterns 120 illustrated in FIG. 1. Some still others of the first RDL patterns 3110 may electrically connect the conductive through vias 3520 of the bridge die 3500 to the outer connectors 3200 through the second RDL patterns 3140.

Referring again to FIG. 10, the stack module 3400S may be vertically stacked on the first semiconductor chip 3300. An adhesive layer 3340 may be disposed between the stack module 3400S and the first semiconductor chip 3300 to attach the stack module 3400S to the first semiconductor chip 3300. The adhesive layer 3340 may fix the stack module 3400S to the first semiconductor chip 3300.

The stack module 3400S may be stacked on the first semiconductor chip 3300 such that an edge of stack module 3400S laterally protrudes from a side surface 3301 of the first semiconductor chip to provide a protruding portion 3435 corresponding to an overhang when viewed from a plan view. The bridge die 3500 may be disposed on the outer RDL structure 3100 to support the protruding portion 3435 of the stack module 3400S. The bridge die 3500 may be configured to include the conductive through vias 3520 electrically connecting the stack module 3400S to the outer RDL structure 3100. The conductive through vias 3520 may vertically penetrate a body 3510 of the bridge die 3500.

A third group of inner connectors 3630 may be provided between the bridge die 3500 and the protruding portion 3435 of the stack module 3400S. The third group of inner connectors 3630 may electrically connect the through vias 3520 of the bridge die 3500 to a second group of chip pads 3410 of the second semiconductor chip 3400 of the stack module 3400S. Accordingly, the protruding portion 3435 of the stack module 3400S may be supported by the second and third groups of inner connectors 3620 and 3630 and may be stably fixed.

The bridge die 3500 may be configured to further include the post bumps (530 of FIG. 1) like the bridge die 500 illustrated in FIG. 1.

The stack module 3400S be configured to include an inner RDL structure 3900, the second semiconductor chip 3400, a capacitor die 3800, and an inner encapsulant 3750. The inner encapsulant 3750 may be formed on the inner RDL structure 3900 to cover the second semiconductor chip 3400 and the capacitor die 3800. The inner encapsulant 3750 may act as a base layer for holding the inner RDL structure 3900, second semiconductor chip 3400, and the capacitor die 3800 to provide one module. The inner encapsulant 3750 may be formed of at least one of various molding materials. The inner encapsulant 3750 may be formed of a molding layer including an epoxy molding compound (EMC) material.

The second semiconductor chip 3400 may be disposed on the inner RDL structure 3900 such that the second group of chip pads 3410 are electrically connected to the inner RDL structure 3900. The capacitor die 3800 may be disposed on the inner RDL structure 3900 to be spaced apart from the second semiconductor chip 3400. The capacitor die 3800 may be configured to include a body 3890 comprised of a silicon material and a capacitor 3830 formed in the body 3890. The inner RDL structure 3900 may be provided as an interconnection structure electrically connecting the capacitor 3830 of the capacitor die 3800 to the second group of chip pads 3410 of the second semiconductor chip 3400.

Figure 11:
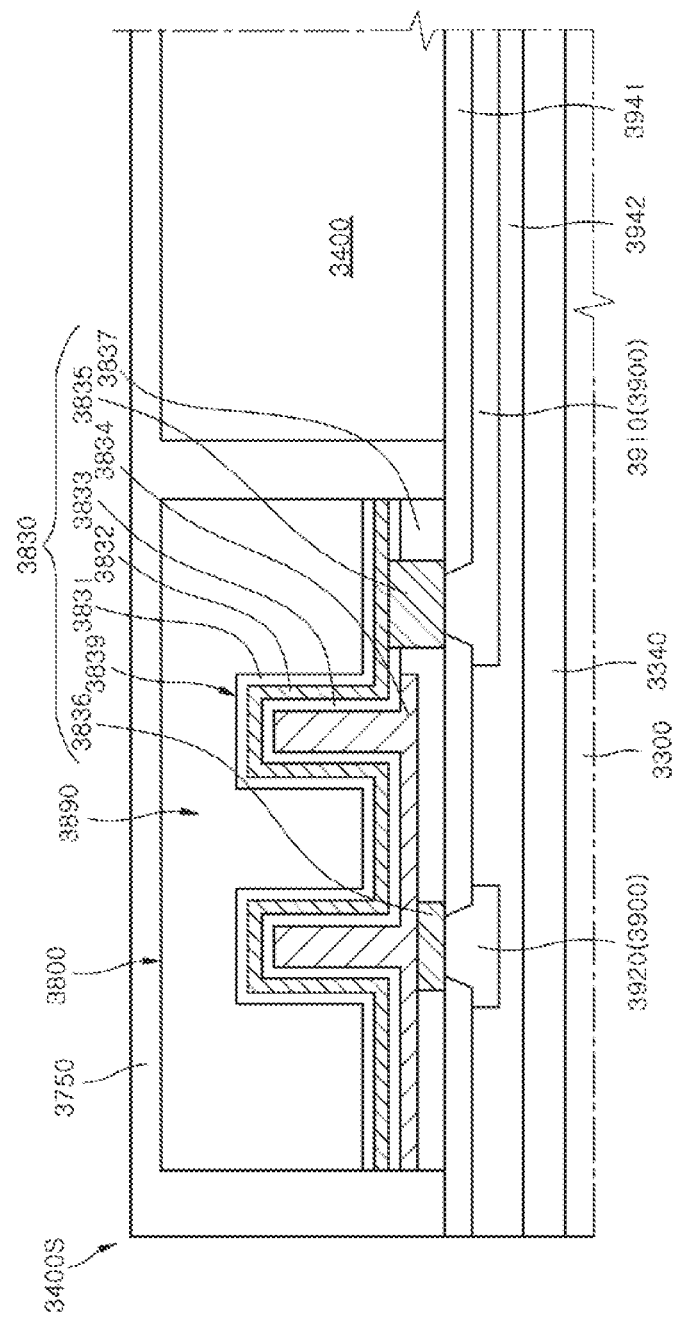
FIG. 11 is a cross-sectional view illustrating a capacitor die of a semiconductor package according to an embodiment.

FIG. 11 is a cross-sectional view illustrating the capacitor die 3800. FIG. 11 is a cross-sectional view illustrating some components of the capacitor die 3800 shown in FIG. 10.

Referring to FIGS. 10 and 11, the capacitor die 3800 may include the capacitor 3830 formed on a surface of the body 3890 of the capacitor die 3800. The capacitor 3830 may be configured to include a first electrode plate 3832, a dielectric layer 3833, and a second electrode plate 3834. The first electrode plate 3832 may be formed on the body 3890 of the capacitor die 3800, the dielectric layer 3833 may be formed on the first electrode plate 3832, and the second electrode plate 3834 may be formed on the dielectric layer 3833. The body 3890 of the capacitor die 3800 may have a surface providing concave trenches 3839. The first electrode plate 3832, the dielectric layer 3833, and the second electrode plate 3834 may further extend into the trenches 3839. An effective overlap area between the first and second electrode plates 3832 and 3834 may increase due to the presence of the trenches 3839, thereby increasing a capacitance value of the capacitor 3830.

A first insulation layer 3831 may be provided between the body 3890 of the capacitor die 3800 and the first electrode plate 3832 to insulate the body 3890 from the first electrode plate 3832. In addition, a second insulation layer 3837 may be additionally formed to cover the capacitor 3830. The capacitor 3830 may further include a first electrode 3835 that penetrates the second insulation layer 3837 to be electrically connected to the first electrode plate 3832. Moreover, the capacitor 3830 may further include a second electrode 3836 that penetrates the second insulation layer 3837 to be electrically connected to the second electrode plate 3834.

Figure 12:
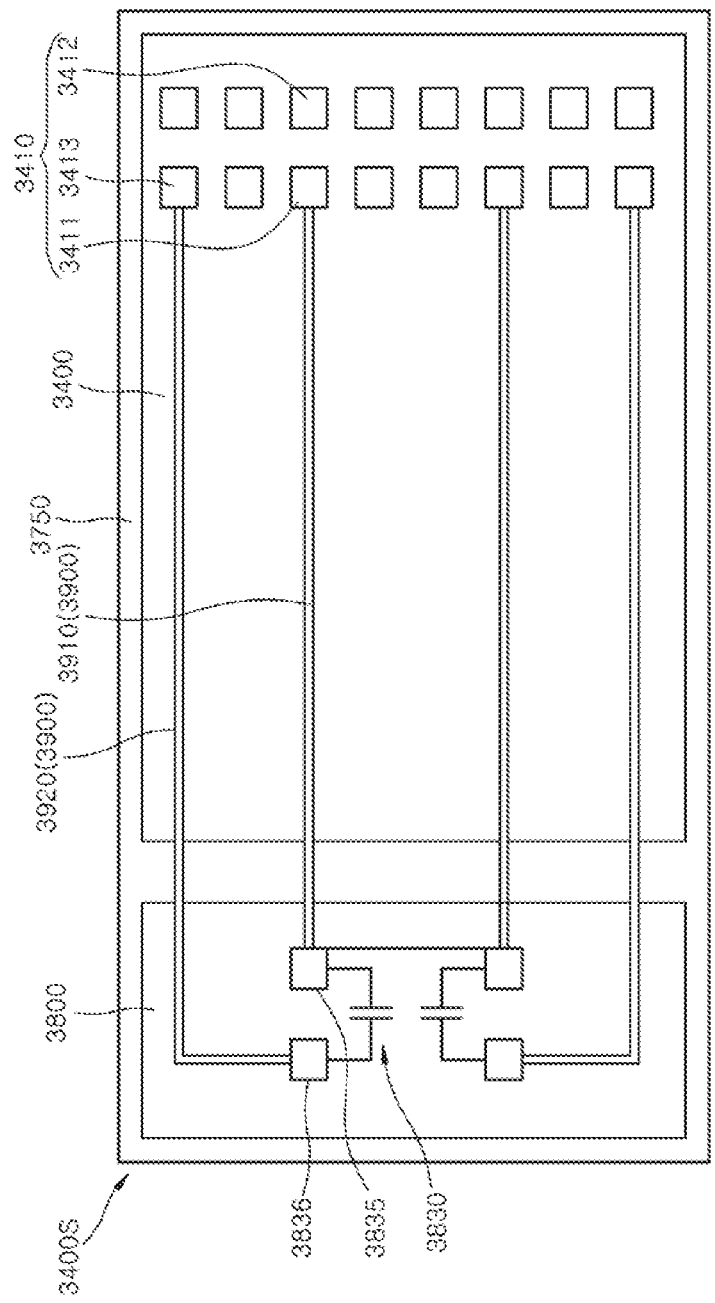
FIG. 12 is a plan view illustrating inner redistributed lines disposed in a stack module of a semiconductor package according to an embodiment.

FIG. 12 is a plan view illustrating first and second inner RDL patterns 3910 and 3920 of the stack module 3400S. FIG. 12 is a plan view illustrating the first and second inner RDL patterns 3910 and 3920 constituting the inner RDL structure 3900 of FIG. 10. The first and second inner RDL patterns 3910 and 3920 in FIG. 12 are illustrated to include only portions connecting the second group of chip pads 3410 to the first and second electrodes 3835 and 3836 without portions covering the second group of chip pads 3410 and the first and second electrodes 3835 and 3836 for the purpose of ease and convenience in explanation.

Referring to FIGS. 10, 11, and 12, the inner RDL structure 3900 may include the first RDL patterns 3910 and the second RDL patterns 3920. The first inner RDL patterns 3910 may be conductive patterns extending to connect the first electrodes 3835 of the capacitors 3830 to first chip pads 3411 of the second group of chip pads 3410. The second inner RDL patterns 3920 may be conductive patterns extending to connect the second electrodes 3836 of the capacitors 3830 to second chip pads 3413 of the second group of chip pads 3410. The first chip pads 3411 may be provided as power terminals for applying a power supply voltage to the second semiconductor chip 3400. The second chip pads 3413 may be provided as ground terminals for supplying a ground voltage to the second semiconductor chip 3400.

According to the above descriptions, the first electrode 3835 of the capacitor 3830 may be connected to an electrical path for applying a power supply voltage to the second semiconductor chip 3400, and the second electrode 3836 of the capacitor 3830 may be connected to another electrical path for supplying a ground voltage to the second semiconductor chip 3400. As such, because the capacitor 3830 is coupled between a power terminal and a ground terminal, the capacitor 3830 may act as a decoupling capacitor of the second semiconductor chip 3400. Thus, the capacitor 3830 may reduce noise when the second semiconductor chip 3400 operates.

When the first and second RDL patterns 3910 and 3920 are formed, overlap pads 3930 may be formed to overlap with third chip pads 3412. The overlap pads 3930 may be conductive pads which are simultaneously formed with the first and second inner RDL patterns 3910 and 3920. The inner RDL structure 3900 may further include a first insulation layer 3941 that is disposed between the second semiconductor chip 3400 and the first and second RDL patterns 3910 and 3920 to insulate the first and second RDL patterns 3910 and 3920 from the second semiconductor chip 3400. The inner RDL structure 3900 may further include a second insulation layer 3942 that is formed to cover the first and second RDL patterns 3910 and 3920.

Referring again to FIG. 10, the capacitor die 3800 may be disposed on the first semiconductor chip 3300 to fully overlap with a portion of the first semiconductor chip 3300. The stack module 3400S may be disposed on the first semiconductor chip 3300. If the stack module 3400S does not include the capacitor die 3800, a space that the capacitor die 3800 occupies may be filled with an encapsulant material, for example, the inner encapsulant 3750 or an outer encapsulant 3700. In such a case, when the semiconductor package 30 is heated up or cooled down, the encapsulant material filling the space of the capacitor die 3800 may be relatively more expanded or shrunk as compared with the first and second semiconductor chips 330 and 3400. This is because the encapsulant material includes a polymer component having a relatively high coefficient of thermal expansion as compared with a silicon material corresponding to a main component of the first and second semiconductor chips 3300 and 3400. Thus, if the stack module 3400S includes the encapsulant material instead of the capacitor die 3800, the semiconductor package 30 may easily warp. However, according to the present embodiment, the stack module 3400S includes the capacitor die 3800 to reduce an amount of the encapsulant material. Accordingly, it may be possible to suppress or prevent the warpage of the semiconductor package 30.

Figure 13:
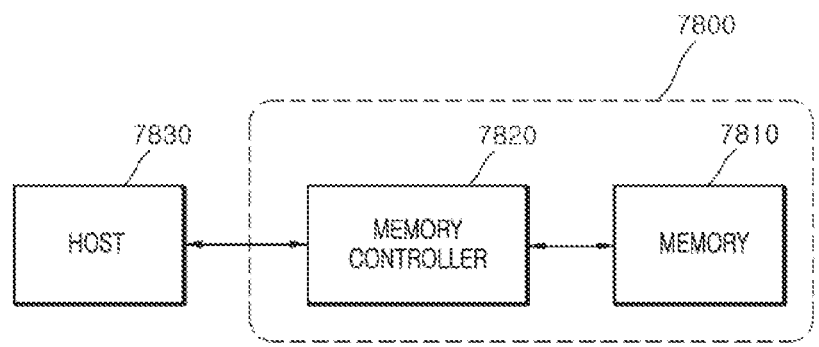
FIG. 13 is a block diagram illustrating an electronic system employing a memory card including at least one SiP or at least one semiconductor package according to an embodiment.

FIG. 13 is a block diagram illustrating an electronic system including a memory card 7800 employing at least one of the system-in-packages (SiPs) and the semiconductor packages according to the embodiments. The memory card 7800 includes a memory 7810 such as a nonvolatile memory device, and a memory controller 7820. The memory 7810 and the memory controller 7820 may store data and read out the stored data. At least one of the memory 7810 and the memory controller 7820 may include at least one SiP or at least one semiconductor package according to an embodiment.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 14:
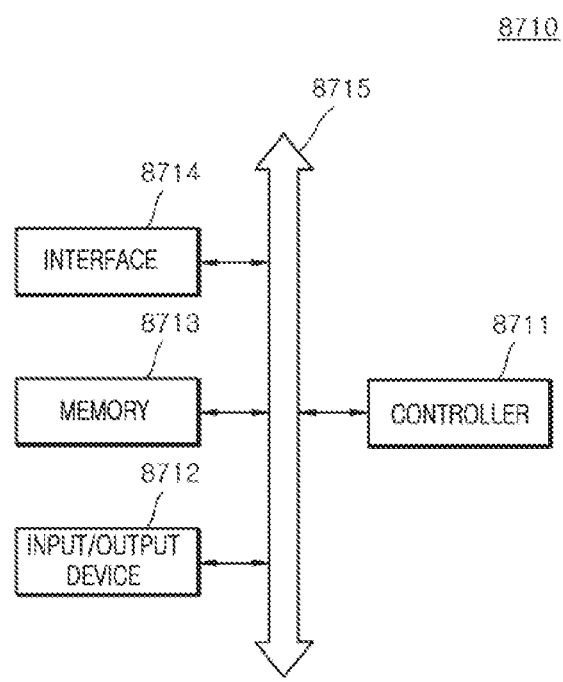
FIG. 14 is a block diagram illustrating another electronic system including at least one SiP or at least one semiconductor package according to an embodiment.

FIG. 14 is a block diagram illustrating an electronic system 8710 including at least one of the SiPs and the semiconductor packages according to the embodiments. The electronic system 8710 may include a controller 8711, an input/output unit 8712, and a memory 8713. The controller 8711, the input/output unit 8712, and the memory 8713 may be coupled with one another through a bus 8715 providing a path through which data moves.

In an embodiment, the controller 8711 may include one or more microprocessor, digital signal processor, microcontroller, and/or logic device capable of performing the same functions as these components. The controller 8711 or the memory 8713 may include at least one of the SiPs and the semiconductor packages according to the embodiments of the present disclosure. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
an outer redistributed line (RDL) structure;
a first semiconductor chip disposed on the outer RDL structure;
a stack module stacked on the first semiconductor chip, wherein a portion of the stack module laterally protrudes from a side surface of the first semiconductor chip in a plan view; and
a bridge die stacked on the outer RDL structure to support the protruding portion of the stack module, wherein the bridge die includes conductive through vias electrically connecting the stack module to the outer RDL structure,
wherein the stack module includes:
an inner RDL structure;
a second semiconductor chip disposed on the inner RDL structure, wherein the second semiconductor chip includes chip pads electrically connected to the inner RDL structure;
a capacitor die disposed on the inner RDL structure and spaced apart from the second semiconductor chip, wherein the capacitor die includes a capacitor electrically connected to the chip pads through the inner RDL structure; and
an inner encapsulant formed on the inner RDL structure to cover the second semiconductor chip and the capacitor die.

2. The semiconductor package of claim 1, wherein the capacitor die overlaps with the first semiconductor die.

3. The semiconductor package of claim 1, wherein the capacitor includes:
a first electrode plate formed on a body of the capacitor die;
a dielectric layer formed on the first electrode plate;
a second electrode plate formed on the dielectric layer; and
a first electrode and a second electrode connected to respective one of the first electrode plate and the second electrode plate.

4. The semiconductor package of claim 3,
wherein the capacitor die includes a body having a surface providing trenches; and
wherein the first and second electrode plates and the dielectric layer extends into the trenches.

5. The semiconductor package of claim 4, wherein the body of the capacitor die is comprised of a silicon material.

6. The semiconductor package of claim 3, wherein the inner RDL structure includes:
a first inner RDL pattern extending to connect the first electrode to a first chip pad of the chip pads, wherein the first chip pad is a power terminal for applying a power supply voltage to the second semiconductor chip; and
a second inner RDL pattern extending to connect the second electrode to a second chip pad of the chip pads, wherein the second chip pad is a ground terminal for applying a ground voltage to the second semiconductor chip.

7. The semiconductor package of claim 1,
wherein the second semiconductor chip includes a memory semiconductor chip storing data; and
wherein the first semiconductor chip includes a system-on-chip (SoC) that communicates with the second semiconductor chip to receive or output the data.

8. The semiconductor package of claim 1, further comprising an adhesive layer provided between the stack module and the first semiconductor chip to attach the stack module to the first semiconductor chip.

9. The semiconductor package of claim 1, wherein the conductive through vias are formed to vertically penetrate a body of the bridge die.

10. The semiconductor package of claim 1, further comprising an outer encapsulant disposed on the outer RDL structure to cover the first semiconductor chip, the bridge die, and the stack module.

* * * * *